United States Patent [19]
Feldt

[11] Patent Number: 5,204,977
[45] Date of Patent: Apr. 20, 1993

[54] APPARATUS AND METHOD OF AUTOMATIC GAIN CONTROL IN A RECEIVER

[75] Inventor: Daniel C. Feldt, Streamwood, Ill.

[73] Assignee: Motorola, Inc., Schaumburg, Ill.

[21] Appl. No.: 678,920

[22] Filed: Apr. 1, 1991

[51] Int. Cl.$^5$ .............................................. H04B 1/06
[52] U.S. Cl. ............................... 455/234.2; 455/240.1; 455/241.1; 455/253.2; 370/95.3
[58] Field of Search ............... 455/234.1, 234.2, 240.1, 455/241.1, 253.2, 200.1, 194.2, 177.1; 375/98; 370/95.3

[56] References Cited

U.S. PATENT DOCUMENTS

| | | | |
|---|---|---|---|
| 3,559,088 | 8/1969 | Booth et al. | 330/285 |
| 4,574,251 | 3/1986 | Jason | 330/279 |
| 4,757,502 | 7/1988 | Meuriche et al. | 370/95.3 |
| 4,933,986 | 6/1990 | Leitch | 455/119 |
| 5,081,653 | 1/1992 | Saito | 375/98 |
| 5,086,437 | 2/1992 | Tomita | 455/234.1 |

*Primary Examiner*—Reinhard J. Eisenzopf
*Assistant Examiner*—Andrew Faile
*Attorney, Agent, or Firm*—Kirk W. Dailey; Roland R. Hackbart; John A. Fisher

[57] ABSTRACT

A radio receiver (107) including at least two amplifier (245, 247, 207) stages each having adjustable gain. The receiver (107) generates a first and a second control signal (267, 229). In absence of receiving an input signal, the receiver (107) adjusts the gain of at least the first of the at least two amplifier stages (207) with said first control signal (229). Upon generation of the second control signal (267) the gain of the first of the at least two amplifiers stages (207) is maintained at a constant level. The gain of a second of the at least two amplifier stages (247) is adjusted with said first control signal (229), producing an output signal (269). A predetermined amplitude of the output signal (269) is maintained while receiving an input signal.

11 Claims, 3 Drawing Sheets

APPARATUS AND METHOD OF AUTOMATIC GAIN CONTROL IN A RECEIVER

FIELD OF THE INVENTION

This invention generally relates to amplifiers contained within a receiver and more specifically to controlling the gain of the amplifiers to maintain proper amplitude of a received signal. Reference is made to U.S. Pat. application No. 07/630,644, "Apparatus and Method for DC Offset Correction for a Receiver", filed on behalf of Rabe et al. on Dec., 20, 1990, assigned to the assignee of the present invention, and containing material which may be related to the present invention.

BACKGROUND OF THE INVENTION

In a typical radio receiver, an antenna receives radio frequency signals and converts them into electrical radio frequency signals. These radio frequency signals are then reduced to a lower frequency signal for amplification in an intermediate frequency (IF) stage. In the IF stage, the signal received from the antenna is amplified and bandpass filtered. Next, the signal is split and input to a quadrature demodulator. The demodulator reduces the frequency of the signal to the base band frequency and prepares the signals for extraction of the useful information. The base band circuitry filters, amplifies and processes the signal extracting the analog or digital data.

A source of distortion in the base band frequency signal occurs when there is a change in the received signal strength. This can occur when a receiver changes from a first frequency to a second frequency, when the source of the received signal changes, or when the receiver changes position relative to the source of the received signal. The relationship between the two signal strengths results in a change of the gain requirements of the variable gain amplifiers (207, 245, 247). Adjustment of the gain of the amplifiers (207, 245, 247) results in a DC component in the base band signal. Adjustment of the gain in the first amplifier (207) may result in a larger DC component than the adjustment of the gain in the other two amplifiers (245,247) in the base band circuitry. Because this amplifier 207 is located in the IF stage of the receiver 107, if the gain is increased, the amount of local oscillator (LO) frequency coupled into this amplifier will increase the DC offset. If there is no LO coupled into this amplifier, than there will be no increase in the DC offset. If the gain on the second amplifier 245 is increased, the DC offset of the BB signal will definitely increase. These changes in DC offset of the first and second amplifiers 207, 245 will result in a DC component significantly larger than an unamplified DC component from the last amplifier (247), because the output from the first and second amplifiers 207,245 are amplified by the last amplifier 247.

The effects of the undesired DC component in the base band signal are illustrated in FIG. 4. FIG. 4A illustrates an ideal representation of an arbitrary signal set represented in signal space by axis 401 projected on to the inphase and quadrature axis 403. FIG. 4B illustrates the result of adding an undesired DC offset 409 to either the I or Q component of the base band signal. The shifts in the I and Q components cause the decision threshold of the I and Q axis 403 to shift, thus, biasing the selection of one symbol over the other, reducing the noise margin for some of the symbols and allowing a reduced margin for error in the presence of uncorrelated noise. The decision thresholds are represented by the I and Q axis 403.

Digital radio receivers have a lower tolerance to DC offset errors than a conventional analog radio receiver. The required change in the gain resulting from a change in frequency of the received signal or change in the source of the received signal is transitory in nature and occurs when the signal being received does not contain any desired data. Thus, the gain of any of the amplifiers (207, 245,247) can be adjusted to provide the proper amplitude of the output signal and the DC offset can be removed as discussed in U.S. Pat. application Ser. No. 07/630,644.

The required change in the gain resulting from a change in the radio receiver's position can occur while the received signal contains desired data. Therefore, the undesired DC offset can not be properly removed, therefore, any significant error will adversely effect the results of the interpolation of the data from the output signal. In order limit the change in the DC component of the output signal, only the gain of the last amplifier should be adjusted while receiving an input signal. The input signal being an RF signal containing desired data and input into the receiver. The output signal defined as the base band signal which is output from the receiver 107.

Therefore, there exists a need for a device to adjust the gain of all the adjustable gain amplifiers after a change in the input signal frequency or change in the source of the input signal and adjust the gain of the last adjustable gain amplifier while receiving an input signal.

SUMMARY OF THE INVENTION

The present invention encompasses a radio receiver including at least two amplifier stages each having adjustable gain. The receiver generates a first and a second control signal. In absence of receiving an input signal, the receiver adjusts the gain of a first of the at least two amplifier stages with said first control signal. Upon generation of the second control signal the gain of said first of the at least two amplifiers stages is maintained at a constant level. The gain of a second of the at least two amplifier stages is adjusted with said first control signal, producing an output signal. A predetermined amplitude of the output signal is maintained while receiving an input signal.

DESCRIPTION OF A PREFERRED EMBODIMENT

Figure 1:
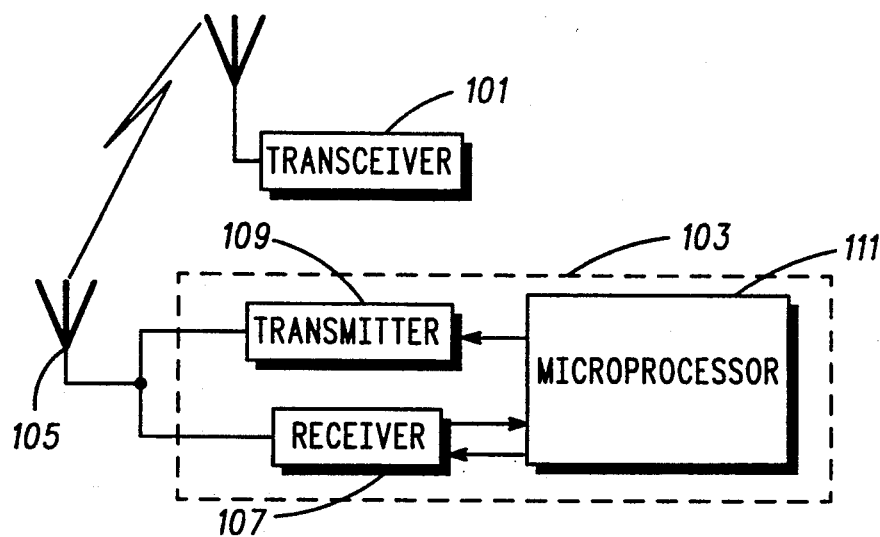
FIG. 1 is a diagram of a radio frequency transmission system including limited detail of a radiotelephone which may employ the present invention.

FIG. 1 illustrates a radio frequency transmission system conveying radio frequency signals between a transceiver 101 and a radiotelephone 103. The transceiver 101 is a fixed site transceiver serving a radio coverage area populated by mobile and portable radiotelephones 103. The radiotelephone 103 includes an antenna 105, a receiver 107, a transmitter 109 and a microprocessor 111, such as the MC68030 available from Motorola, Inc. The transceiver 101 transmits radio frequency signals into its coverage area populated by the radiotelephone 103. The antenna 105 is coupled to the receiver 107 of the radiotelephone 103 and transduces the radio frequency signals into electronic radio frequency signals for use by the receiver 107. The receiver converts the received signals into data which can be processed by the microprocessor 111. The transmitter 109 receives data signals from the microprocessor 111 and converts the signals to electrical radio frequency signals, which are then transmitted to the transceiver 101 via the antenna 105.

Figure 2:
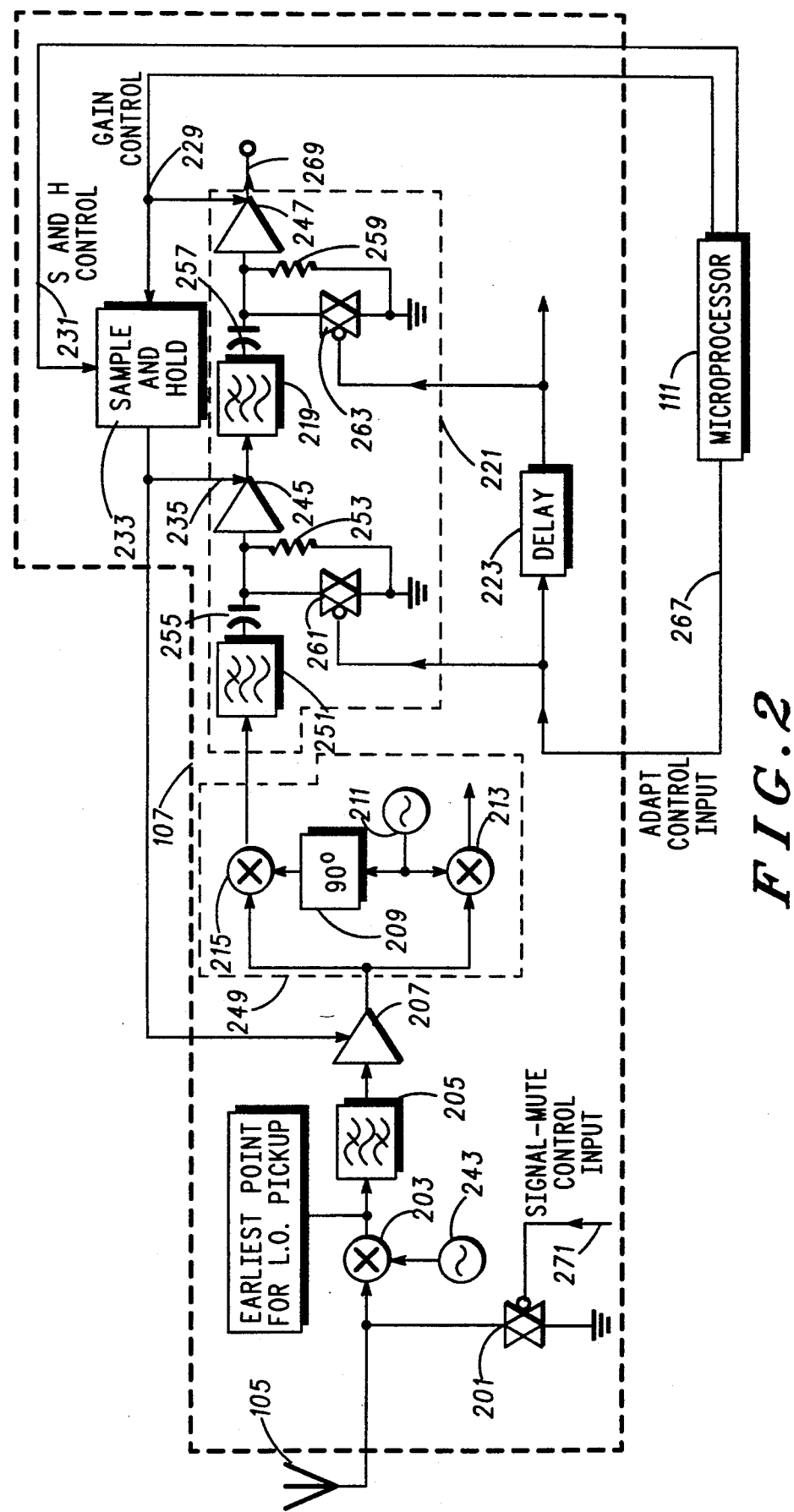
FIG. 2 is a circuit diagram of a receiver which may employ the present invention.

FIG. 2 contains a circuit diagram of the receiver 107 used by the radiotelephone 103. After receiving the electrical radio frequency signals from the antenna 105, the mixer 203 mixes the local oscillator frequency 243 with the incoming radio frequency signals, reducing the frequency of the signals to an intermediate frequency (IF). Switch 201 allows the received electrical radio frequency signals to be muted upon activation of the signal-mute control signal 271 as indicated in FIG. 2. The signals at this point are referred to as IF signals. After passing the IF signals through a band-pass filter 205, the first adjustable gain control amplifier 207 amplifies the IF signals to a desired amplitude. The amplifier 207 is one of three amplifiers 207, 245, 247 in this receiver which have adjustable gain control, the other two amplifiers 245, 247 are contained in the base band circuitry. The combination of these three amplifiers 207, 245,247 maintain the output signal 269 at the desired amplitude; avoiding saturation and allowing proper interpretation of the data contained within the signal by the remaining circuitry of the radiotelephone 103. After the IF signal is output from the amplifier 207, the IF signals are input into the quadrature demodulating circuit 249.

The quadrature demodulator circuit 249 is made up of two mixers 213, 215, a local oscillator 211 a power splitter 209. Combination of the local oscillator 211 and the power splitter 209 creates two local oscillator signals 90° out of phase with each other, referred to as the inphase and quadrature components of the local oscillator 211. The inphase component of the local oscillator 211 is input into the mixer 213. The quadrature component of the local oscillator is input into mixer 215. For the purposes of simplicity, the inphase portion of the remaining circuitry is eliminated because it is an exact duplication of the quadrature circuitry. The quadrature mixer 215 mixes the IF signals with the quadrature component of the local oscillator 211, resulting in a quadrature (Q) data signal. The mixer 213 mixes the IF signal with the inphase component of the local oscillator signal 211, resulting in an inphase (I) data signal. The resulting I and Q data signals are considered base band (BB) signals and are then interpreted by the base band circuitry to form digital data to be used by the radiotelephone 103.

The base band circuitry 221 contains two amplifier stages. Each amplifier stage contains one adjustable gain controlled a resistor 253 and a capacitor 255. The incoming base band a resistor 253 and a capacitor 255. The incoming base band signal which is the output of mixer 215, is input into the low pass filter 251. The output of the low pass filter 251 is connected to the non-inverting input of the adjustable gain amplifier 245 through the coupling capacitor 255. A resistor 253 is connected in parallel between electrical ground and the output of the capacitor 255. The adapt control switch 261 is connected in parallel with the resistor 253 between the output of the capacitor 255 and electrical ground. There is also a gain control input signal 235 connected to the variable gain amplifier 245. The preceding amplifier stage is duplicated at the output of the adjustable gain amplifier 245. It contains low pass filter 219, capacitor 257, resistor 259, adaptive control switch 263, a variable gain amplifier 247 and a gain control input signal 229. The BB circuitry 221 also contains a sample and hold circuit 233 and a delay circuit 223.

Two algorithms contained within the microprocessor 111 generate the control signals for the receiver 107. The microprocessor 111 can be contained within the receiver 107 and dedicated to the receiver 107, or the microprocessor 111 can be contained within the radiotelephone and the microprocessor power can be shared with other devices within the radiotelephone 103. The control signals include an adapt control signal 267, gain control signal 229 and a sample and hold control signal 231. The adapt control signal 267 is used to activate adapt control switches 261, 263. These switches are activated in absence of an input signal to quickly remove the undesired DC offset created by a change in the frequency of the local oscillator 243 or in a change in the radio frequency source caused by a hand-over from one fixed site transceiver 101 to another fixed site transceiver. This hand-over causes an abrupt change in the radio frequency signal strength and thus requires changes in the gain of the three amplifiers 207, 245, 247. The gain control signal 229 is coupled to the adjustable gain control input of the last amplifier 247 and to the sample and hold circuit 233. The output of sample and hold circuit is connected to the first and the second adjustable gain control amplifiers 207, 245. The sample and hold control signal 231 is coupled to the sample and hold circuit 233 and upon assertion of this signal, the output of the sample and hold circuit 235 is held at a constant voltage level.

Figure 3:
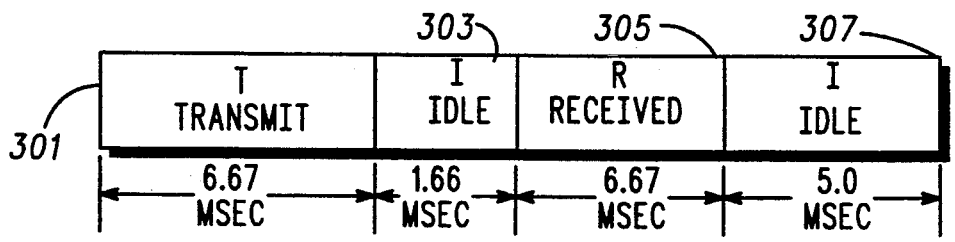
FIG. 3 is a timing diagram used in a time division multiple access (TDMA) radio frequency transmission system.

This radio receiver 107 is designed for use in a radiotelephone 103 to be used in a United States Digital Cellular (USDC) radiotelephone system. The radiotelephone 103 transmits and receives time division multiple access (TDMA) data from the fixed site transceiver 101. In a TDMA system, the radiotelephone 103 only transmits and receives radio frequency signals from the fixed site transceiver 101 during predetermined time blocks. An example of a TDMA transmit and receive timing diagram is shown in FIG. 3. The first block 301 is a transmit block in which the transmitter 109 is active for 6.67 millicseconds and it tranmsmits data from the radiotelephone 103 to the transceiver 101. The second block 303 is the idle time of the radiotelephone 103 between the transmit block 301 and the receive block 305. In this example the idle time has a 1.66 millisecond duration. The third block 305 is the receive block. During this time, the radiotelephone 103 receives radio frequency signals from the transceiver 101. The duration of this time block is 6.67 milliseconds for this application. The fourth block is a second idle period 307. This period occurs after the receive block 205 and prior to a new TDM time frame in which there will be a subsequent transmit block. In this application, the duration of the second idle time block 307 is 5 milliseconds. The duration of the receive block 305 is quite long when it is compared to the Group Speciale Mobile (GSM) European Digital Radiotelephone System. In the GSM application, the receive block was 0.577 milliseconds in duration. The significantly shorter period of time allowed the radiotelephone to fix the gain of the adjustable gain amplifiers in the receiver 107 prior to receiving signals from the fixed site transceiver 101 without affecting the quality of the data recovered. However, in the USDC application, the receive block is more than 12 times longer then the receive block of the GSM application, thus, during this longer duration of receive time, the RF signal strength can fluctuate dramatically, possibly as much as 30 dB. This embodiment alleviates this problem.

The method of removing the undesired DC offset from the base band signals is detailed in U.S. Pat. application No. 07/630,644. The method of controlling the gain control signal and the sample and hold control signal is as follows. Activate the signal-mute control signal 271 which mutes the received input signal from the transceiver 107 using the switch 201. In absence of receiving an input signal from the transceiver 101, the gain control signal controls the gain of all three amplifiers 207, 245, 247. At a point in time prior to the beginning of the receive control block 305, the sample and hold control signal 231 is asserted, holding the current signal level on the gain control signal 235, thus, the gain of amplifiers 207 and 245 are maintained constant until the sample and hold control signal is de-asserted. The sample and hold control signal is de-asserted after the duration of the receive time block 305. During the receive time slot 305, the sample and hold control signal 231 is asserted and the gain control signal 229 generated by the microprocessor 111 controls only the gain of the last amplifier 247.

Figure 5:
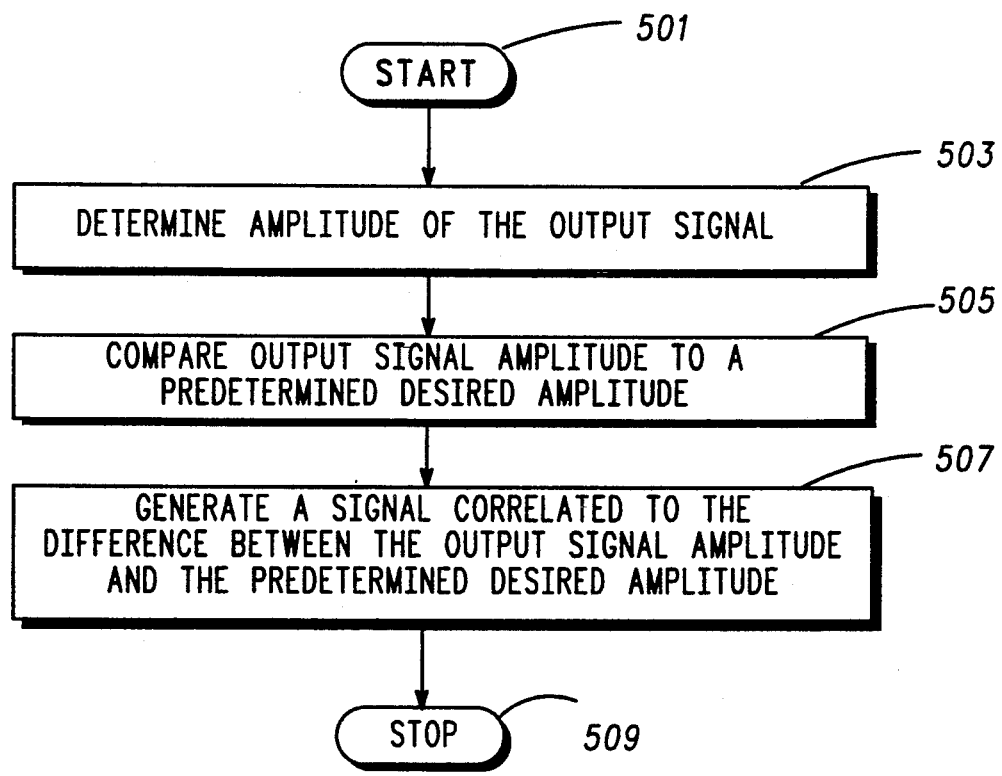
FIG. 5 is a process flow chart of a method to maintain a constant amplitude of an output signal of a receiver which may employ the present invention.

The method of controlling the gain control signal 229 during a receive time block 305 is illustrated in the process flowchart in FIG. 5. At 503, the process determines the amplitude of the output signal generated by the last amplifier 247. At 505, the process compares the amplitude to a predetermined amplitude. At 507, the process generates a signal for the gain control signal correlated to the difference between the output signal and the predetermined amplitude.

Controlling the gain of the last stage of amplification prior to outputting the signal from the receiver 107 allows for minimum DC offset error, but also allows for a reduced amount of error due to changes in the signal strength of the input signal during a receive block 305.

Figure 4A:
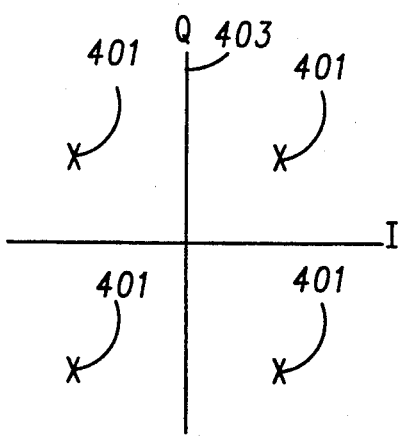
FIG. 4A is a picture of ideal arbitrary signals transposed onto the inphase and quadrature axis.
Figure 4B:
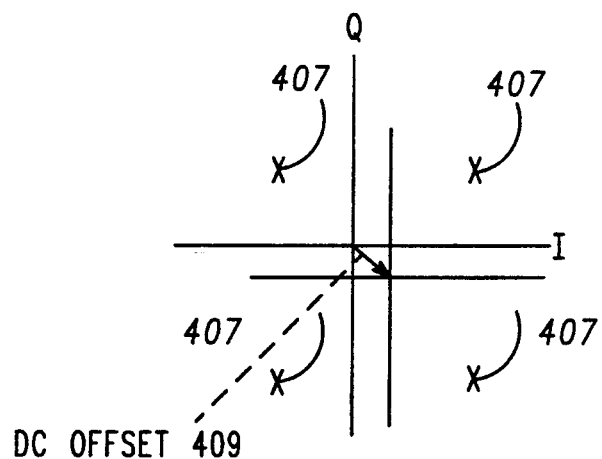
FIG. 4B is a picture of arbitrary signals containing an undesired DC offset and transposed onto the inphase and quadrature axis.

FIG. 4, as previously explained, illustrates the effect of an undesired DC offset voltage which can be caused by amplification of the DC offset generated by changing the gain of the first two amplifiers 207, 245 during a receive time slot 305. FIG. 4A illustrates an ideal representation of an arbitrary signal set represented in signal space by axis 401 projected on to the inphase and quadrature axis 403. FIG. 4B illustrates the result of adding an undesired DC offset 409 to either the I or Q component of the base band signal. The shifts in the I and Q components cause the decision threshold of the I and Q axis 403 to shift, thus, biasing the selection of one symbol over the other, reducing the noise margin for some of the symbols and allowing a reduced margin for error in the presence of uncorrelated noise. The decision thresholds are represented by the I and Q axis 403. This embodiment is capable of removing undesired DC offset from the base band frequency signals without regard to the source of distortion. Secondly, it allows for adjustments in the amplitude of the output signal to correct for changes in the RF signal strength during reception of an input signal. A person with average skill in the art, could apply the invention disclosed herein to similar embodiments not limited to the following: radio receivers which convert the receive input signal directly to the base band frequency, or radio receivers which contain only two stages of amplification, or radio receivers which contain more than three stages of amplification in the base band circuitry, or radio receivers including the embodiments of U.S. Pat. application Ser. No. 07/630,644.

What is claimed is:

1. A radio receiver capable of receiving an input signal and including at least two amplifier stages each having adjustable gain, the radio receiver comprising:
   means for generating a first and a second control signal;
   means for adjusting the gain of a first of the at least two amplifier stages in accordance with said first control signal in absence of an input signal;
   means, responsive to said second control signal, for maintaining the gain of said first of the at least two amplifiers stages at a constant level;
   means for adjusting the gain of a second of the at least two amplifier stages in accordance with said first control signal to produce an output signal; and
   means for maintaining a predetermined amplitude of said output signal while receiving an input signal.

2. A radio receiver (107) in accordance with claim 1 wherein said means, responsive to said second control signal, for maintaining the gain of said first of the at least two amplifiers stages (245, 247), is further characterized by a sample and hold electrical circuit (233).

3. A radio receiver in accordance with claim 1 wherein the radio receiver further comprises a time division multiple access (TDMA) radio receiver.

4. A radio receiver in accordance with claim 1 wherein said means for maintaining a predetermined amplitude of said output signal further comprises:
   means for determining an amplitude of said output signal;
   means for comparing said amplitude to said predetermined amplitude; and
   means for adjusting said gain of said second of the at least two amplifiers.

5. A radio receiver capable of receiving an input signal and including base band (BB) circuitry, the radio receiver comprising:
   means for generating a first and a second control signal;
   means for setting the gain of a first of at least two amplifier stages in the BB circuitry with said first control signal, in absence of an input signal;
   means for setting the DC level of an output of each of said at least two amplifier stages in the BB circuitry with said second control signal in absence of an input signal;
   means for adjusting the gain of a second of the at least two amplifier stages in accordance with said first control signal to produce an output signal; and means for maintaining a predetermined amplitude of said output signal when said input signal is present.

6. A radio receiver in accordance with claim 5 wherein the radio receiver further comprises a time division multiple access (TDMA) radio receiver.

7. A radio receiver in accordance with claim 5 wherein the radio receiver further comprises means for muting the input signal from the radio receiver resulting in said absence of the input signal.

8. A radio receiver in accordance with claim 5 wherein said means for maintaining a predetermined amplitude of said output signal further comprises:
   means for determining an amplitude of said output signal;
   means for comparing said amplitude to said predetermined amplitude; and
   means for adjusting said gain of said second of the at least two amplifiers.

9. A method of controlling the gain of at least two amplifier stages contained within a receiver, the receiver capable of receiving an input signal, comprising the steps of:
   generating a first and a second control signal;
   adjusting the gain of a first of the at least two amplifier stages in accordance with said first control signal in absence of an input signal;
   maintaining, responsive to said second control signal, the gain of said first of the at least two amplifiers stages at a constant level;
   adjusting the gain of a second of the at least two amplifier stages in accordance with said first control signal to produce an output signal; and
   maintaining a predetermined amplitude of said output signal while receiving an input signal.

10. A method of controlling the gain of at least two amplifiers stages contained within a receiver in accordance with claim 9 wherein the receiver further comprises a time division multiple access (TDMA) radio receiver.

11. A method of controlling the gain of at least two amplifiers stages contained within a receiver in accordance with claim 9 wherein said maintaining a predetermined amplitude of said output signal further comprises the steps of:
   determining an amplitude of said output signal;
   comparing the amplitude to said predetermined amplitude; and
   generating a third control signal correlated to the difference between said output signal amplitude and the predetermined amplitude.

* * * * *